(12) United States Patent
Hossain et al.

(10) Patent No.: US 10,278,292 B2
(45) Date of Patent: Apr. 30, 2019

(54) METHOD FOR ORIENTING SOLDER BALLS ON A BGA DEVICE

(71) Applicant: Intel Corporation, Santa Clara, CA (US)

(72) Inventors: Md Altaf Hossain, Portland, OR (US); Scott A. Gilbert, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 451 days.

(21) Appl. No.: 14/992,919

(22) Filed: Jan. 11, 2016

(65) Prior Publication Data

US 2016/0128207 A1 May 5, 2016

Related U.S. Application Data

(63) Continuation of application No. 13/631,683, filed on Sep. 28, 2012, now Pat. No. 9,237,659.

(51) Int. Cl.
| | | |
|---|---|---|
| *H01R 9/00* | (2006.01) | |
| *H05K 3/00* | (2006.01) | |
| *H05K 3/34* | (2006.01) | |
| *H05K 1/11* | (2006.01) | |
| *H01L 23/498* | (2006.01) | |
| *H01L 21/48* | (2006.01) | |
| *B23K 31/02* | (2006.01) | |

(52) U.S. Cl.
CPC ............ *H05K 3/3436* (2013.01); *B23K 31/02* (2013.01); *H01L 21/4853* (2013.01); *H01L 23/49816* (2013.01); *H05K 1/111* (2013.01); *H01L 2224/16* (2013.01); *H01L 2924/0002* (2013.01); *H05K 3/3478* (2013.01); *H05K 2201/09745* (2013.01); *H05K 2203/041* (2013.01); *Y02P 70/611* (2015.11); *Y02P 70/613* (2015.11); *Y10T 29/49149* (2015.01)

(58) Field of Classification Search
CPC ................. H05K 3/3436; H05K 1/111; H05K 2203/041; H05K 2201/09745; H05K 3/3478; B23K 31/02; H01L 21/4853; H01L 23/49816; H01L 24/14; H01L 2224/16; H01L 2924/0002; Y02P 70/613; Y02P 70/611; Y10T 29/49144; Y10T 29/49149; Y10T 29/49206
USPC ........... 29/832, 840, 843, 875; 257/734, 737
See application file for complete search history.

(56) References Cited

U.S. PATENT DOCUMENTS

| | | | |
|---|---|---|---|
| 7,084,500 B2 | 8/2006 | Swnson et al. | |
| 7,564,130 B1 * | 7/2009 | Li .......................... | H01L 24/14 257/734 |
| 7,714,437 B2 * | 5/2010 | Naya .................. | H01L 23/49816 257/737 |

* cited by examiner

*Primary Examiner* — Donghai D Nguyen
(74) *Attorney, Agent, or Firm* — Schwabe, Williamson & Wyatt P.C.

(57) ABSTRACT

A BGA structure having larger solder balls in high stress regions of the array is disclosed. The larger solder balls have higher solder joint reliability (SJR) and as such may be designated critical to function (CTF), whereby the larger solder balls in high stress regions carry input/output signals between a circuit board and a package mounted thereon. The larger solder balls are accommodated by recessing each ball in the package substrate, the circuit board, or both the package substrate and the circuit board. Additionally, a ball attach method for mounting a plurality of solder balls having different average diameters is disclosed.

8 Claims, 6 Drawing Sheets

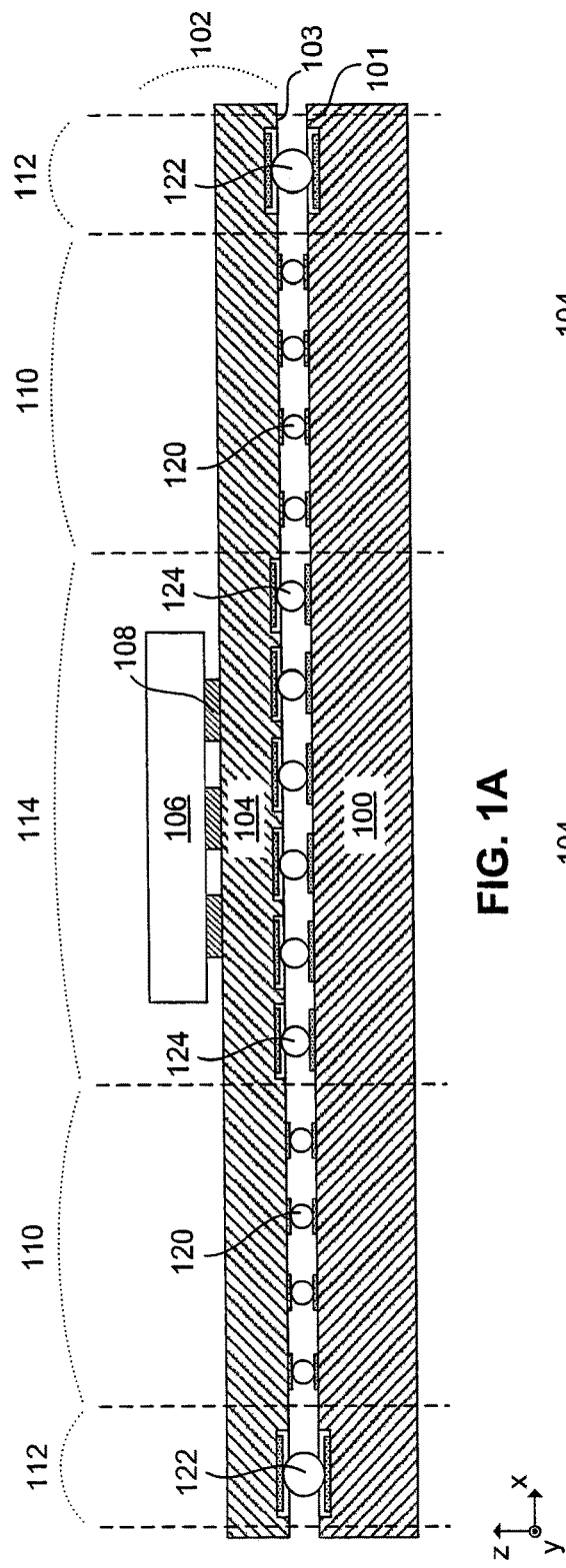
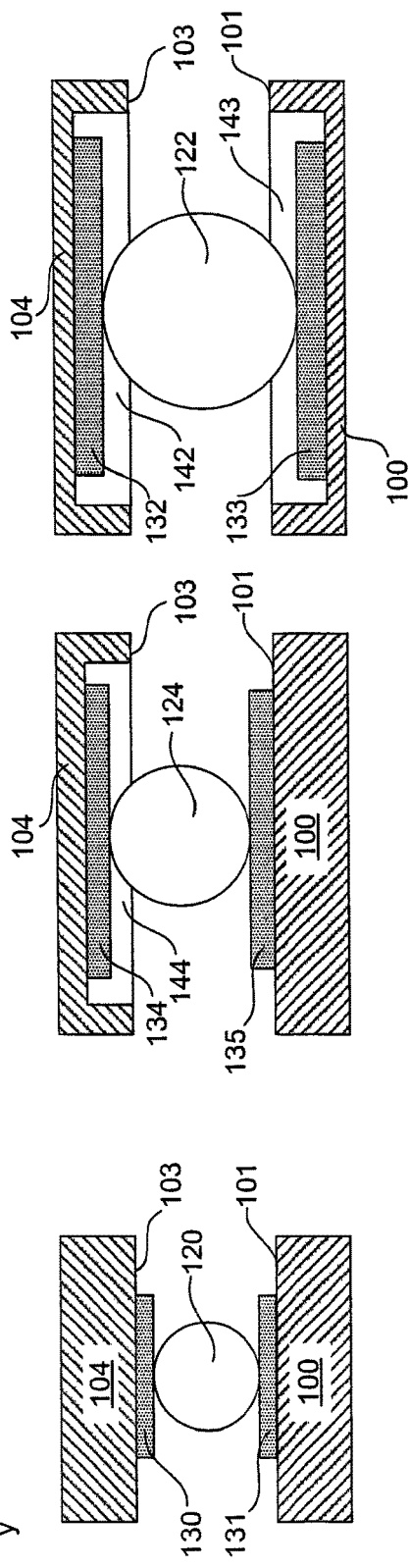
FIG. 1A
FIG. 1B
FIG. 1C
FIG. 1D

METHOD FOR ORIENTING SOLDER BALLS ON A BGA DEVICE

This is a Continuation application of Ser. No. 13/631,683 filed Sep. 28, 2012, which is presently pending.

BACKGROUND

Mobile, tablet, and ultrabook technologies require components with increasingly reduced dimensions. The form factor and footprint of components may be decreased by reducing the real estate required to mount components to a printed circuit board (PCB). The Ball Grid Array (BGA) technique uses solder balls or bumps to electrically and mechanically attach components, such as a packaged die, to a PCB. Current designs employ non-critical to function (NCTF) balls in regions of high stress, such as in the corner and die shadow regions of the mounting surface of a package. NCTF balls serve primarily a structural role, and are not used to carry input/output signals due to the low solder joint reliability (SJR) of balls in high stress regions.

BRIEF DESCRIPTION OF THE DRAWINGS

FIG. 1A illustrates a cross-sectional view of a package mounted to a circuit board using plurality of critical to function (CTF) solder balls having a different average diameters, according to an embodiment of the invention.

FIG. 1B illustrates a cross-sectional view of a surface-mounted solder ball within a low stress region of the package surface, according to an embodiment of the invention.

FIGS. 1C-1D illustrate cross-sectional views of recess-mounted solder balls within high stress regions of the package surface, according to an embodiment of the invention.

DETAILED DESCRIPTION

Figure 2A:
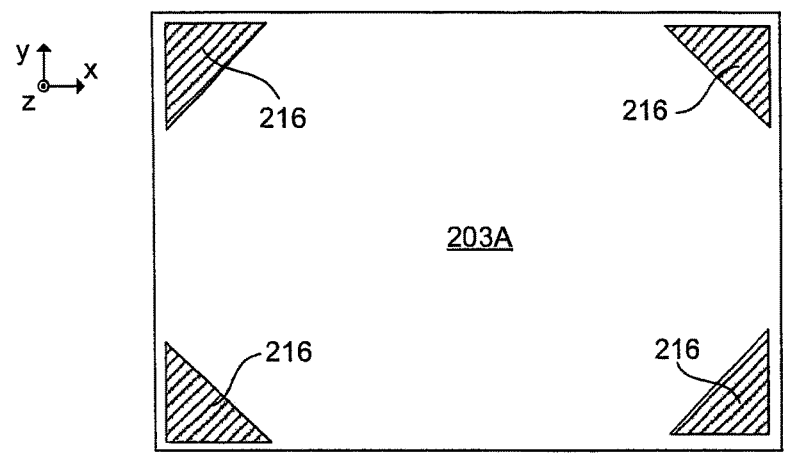
FIGS. 2A-2C illustrate planar views of high stress regions of a package substrate, according to an embodiment of the invention.

A ball grid array (BGA) structure having larger balls in high stress regions of the package-substrate interface, and method of mounting using a plurality of BGA ball sizes are described. In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment," "an embodiment" or the like in various places throughout this specification are not necessarily referring to the same embodiment of the invention. Furthermore, the particular features, structures, configurations, or characteristics may be combined in any suitable manner in one or more embodiment.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Conventional ball grid array (BGA) mounting methods typically use a single size of solder ball to joint two substrate surfaces. Stresses evolve at the solder joint during package fabrication, assembly, or operation due to differences in thermal expansion between the two joined components. Solder balls in certain regions of the package surface may experience higher stresses than others, such as regions in proximity to mounted package components, such as a die, or in proximity to the package perimeter, such as in corner regions. Solder balls in these regions of high stress may have low solder joint reliability (SJR), and as a result may be designated not critical to function (NCTF). NCTF solder balls do not carry input/output signals, which are critical to the functioning of the package. Such NCTF balls may serve a structural role or may carry power, but occupy area on the mounting surface of the package without providing input/output functionality.

In one aspect, embodiments of the invention describe a BGA structure having reduced x-y dimensions due to the reduction or elimination of NCTF solder balls. For example, in an embodiment of the invention, solder balls within high stress regions of the interface of a package and circuit board have a larger average diameter than smaller solder balls within comparatively lower stress regions of the package mounting surface. The solder joints incorporating larger solder balls are able to endure higher stresses than the solder joints incorporating smaller solder balls. The larger solder balls within the high stress regions have an improved SJR as compared to the use of smaller solder balls in such high stress regions, and as such may be made critical to function (CTF). That is, the larger solder balls within high stress regions may carry input/output signals between the circuit board and the package. By enabling the use of CTF balls within high stress regions of the package surface, area of the package surface that was previously dedicated to NCTF solder joints may be eliminated, reducing the minimum x-y dimensions needed to meet the i/o and power requirements for a given package or component.

The BGA structure standoff distance between the package and the circuit board is dictated by the smaller solder balls in lower stress regions. The larger solder balls may be incorporated into the BGA structure without increasing the standoff distance by recessing the larger solder balls within the package surface, the circuit board surface, or both. Larger solder balls may be individually recessed, recessed in groups, or the entire high stress region may be recessed to accommodate the larger solder balls. The larger solder balls may be mounted on conductive pads that are the same size as the pads on which the smaller solder balls are mounted, or, larger pads may be used with the larger solder balls in order to further improve SJR.

As will be understood in light of further details disclosed, three, four, or a larger plurality of solder ball sizes may be used by varying the amount to which each size is recessed within the mounting surfaces. In addition, the teachings disclosed herein may be applied to a variety of electronic packaging applications in addition to BGA, such as chip scale packaging (CSP), and flip-chip structures.

In another aspect, embodiments of the invention describe a method for mounting a package on a circuit board using plurality of sizes of solder balls. For example, in order to mount two sizes of solder balls on a die surface, a stencil is used that has two sizes of holes, each sized to correspond to the average diameter of each size of solder ball. First, the largest size of solder ball is mounted by seating them in the larger holes of the stencil. The larger solder balls do not fit within the holes corresponding to the smaller average diameter solder balls, and therefore do not seat in positions on the package surface intended for the small solder balls. Next, the smaller solder balls are mounted by seating them in the smaller sized holes of the stencil. Because the larger holes are occupied by the larger average diameter solder balls, the smaller average diameter solder balls are not seated in the positions intended for the larger solder balls. In another example, the method may be used to mount more than two sizes of solder balls. The largest solder balls are mounted first in the largest holes, followed by the next largest solder balls in the next largest holes, and so on in order of decreasing average diameter, mounting the solder balls having the smallest average diameter last. This method may be applied to seating solder balls on a die surface, on a package surface, or on the surface of a PCB.

FIGS. 1A-1D illustrates a cross-sectional view of BGA structure, where a package 102 is mounted to a circuit board 100 via a plurality of solder balls 120/122/124. In an embodiment, the structure incorporates smaller solder balls 120 in low stress regions 110 and larger CTF solder balls 122/124 in high stress regions 112/114 of the package surface 103, according to an embodiment of the invention. In an embodiment, circuit board 100 is a PCB. In an embodiment, circuit board 100 includes one or more buildup layers (not shown) that each comprises metallization and insulation. However, it is to be appreciated that the inventive features described may be used in association with a wide variety of surfaces, such as a printed circuit board (PCB), package substrate, die, interposer, etc.

In an embodiment, package 102 includes a package substrate 104 and a die 106. In an embodiment, package substrate 104 contains a plurality of buildup layers. Die 106 is mounted on package substrate 104 via conductive terminals 108, according to an embodiment. It is to be understood that package 102 may include additional elements not shown, for example, surface components (e.g. capacitors, resistors, additional dies), underfill or encapsulation material, or a cover shield.

Package 102 is mounted on the surface of circuit board 100 via BGA solder joints incorporating solder balls 120/122/124 and conductive pads 130/132/134 according to an embodiment of the invention. In an embodiment, solder balls 120/122/124 are formed from conventional solder materials, such as Sn, Ag, and Cu. In an embodiment, conductive pads 130/132/134 are formed from conventional pad materials, such as Cu.

Figure 2B:
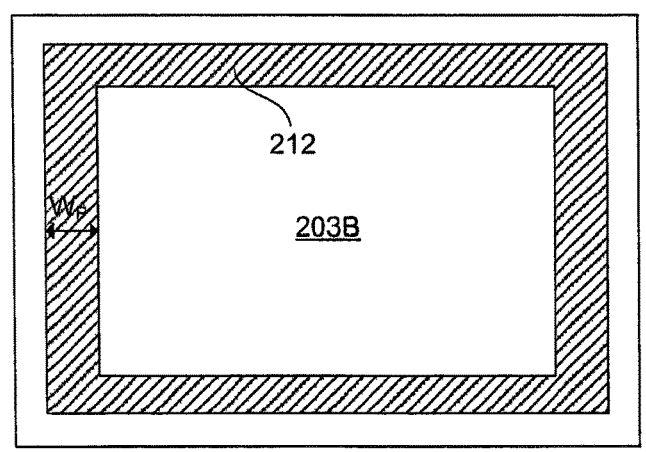
Figure 2C:
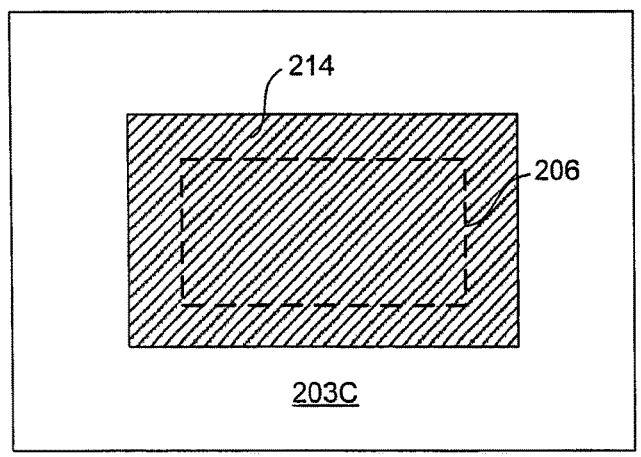

In an embodiment, the solder joints within high stress regions 112/114 experience greater stress than the solder joints within lower stress regions 110. Package 102 may have high stress regions having a variety of configurations. FIGS. 2A-2C illustrate example embodiments of high stress regions, relative to a package surface 203A/203B/203C, as viewed in the x-y plane. For example, FIG. 2A illustrates a number of corner high stress regions 216 relative to a package surface 203A, according to an embodiment. Thermal stress is minimized at the package neutral point, which for a rectangular package where the die is centered with respect to the package perimeter is located at the center of the package surface. Stress increases with distance from the neutral point, which is greatest in package corner regions. The corner regions may also experience high stresses due to the lack of surrounding balls to share/distribute thermal stress. The area of corner high stress regions, relative to the total area of the package, will depend on the stiffness and the coefficient of thermal expansion (CTE) of the package, the stiffness and CTE of the circuit board, and the materials and specifications for the solder joints, including solder joint height and pad size.

FIG. 2B illustrates a peripheral high stress region 212 relative to a package surface 203B, according to an embodiment. In an embodiment, peripheral high stress region 212 extends around the periphery of package surface 203B. The width $W_p$ of peripheral high stress region 212 is dependent on the dimensions, stiffness, CTE of both the package and the circuit board. In addition, the width $W_p$ may vary between the portions of the periphery of package surface 203B that extend in the x and y directions.

FIG. 2C illustrates a die shadow high stress region 214 relative to a package surface 203C, according to an embodiment of the invention. When a die is mounted to a package substrate, the die restricts the thermal expansion of the package substrate, which can give rise to increased stress as the circuit board and the package expand at different rates with increasing temperature. In an embodiment, the die shadow high stress region 214 extends beyond the die footprint 206. In an embodiment, the die shadow high stress region 214 is up to 15% larger than the die footprint 206.

As shown in FIG. 1A, in an embodiment, the die 106 is mounted on the surface of package substrate 104 opposite the circuit board 100. In such a case, now referring to FIG. 2C, the die shadow high stress region 214 includes the die footprint 206. In an embodiment, additional package components, for example capacitors, are mounted within the die footprint portion 206 of the die shadow high stress region 214. In another embodiment, the die is mounted on the package substrate surface facing the circuit board, in which case solder joints are formed within a portion of the die shadow high stress region 214 surrounding the die. It is to be understood that a package surface may have multiple or overlapping high stress regions.

Referring to FIGS. 1A and 1B, solder balls 120 electrically and mechanically connect package 102 to circuit board 100 within lower stress regions 110, according to an embodiment of the invention. In an embodiment, solder balls 120 have an average diameter prior to bonding and reflow, which determines the standoff height between the mounting surface 103 of package substrate 104 and the land surface 101 of circuit board 100. In an embodiment, solder balls 120 are mounted on conductive pads 130 formed on the mounting surface 103 of package substrate 104. In an embodiment, solder balls 120 are mounted on conductive pads 131 formed on the land surface 101 of circuit board 100. It is to be understood that the ball spacing and arrangement within the lower stress regions 110 may vary from that which is illustrated in FIG. 1A, as required by different package designs.

In an embodiment, as shown in FIGS. 1A and 1C, solder balls 124 attach package 102 to circuit board 100 within die shadow high stress region 114. In an embodiment, one or more of solder balls 124 are CTF solder balls that carry input/output signal or power between circuit board 100 and package 102. In an embodiment, all of solder balls 124 are CTF. In an embodiment, some of solder balls 124 are CTF, while others are NCTF. Because at least one of the solder balls 124 in high stress region 114 is CTF, input/output signals that previously had to be routed through a lower stress region 110 of the package surface (e.g. in cases where high stress regions contain only NCTF solder balls) may be routed through the high stress region 114, reducing the x-y area of the package 102 required to accommodate the minimum number of CTF solder joints.

In an embodiment, the average diameter of solder balls 124 is larger than the average diameter of solder balls 120. In an embodiment, the average diameter of solder balls 124 prior to bonding and reflow is 10 to 30% larger than the average diameter of solder balls 120 prior to bonding and reflow. In an embodiment, the average diameter of solder balls 124 is 50-75 um larger than the average diameter of solder balls 120. In order to accommodate the greater average diameter of solder balls 124 as compared to solder balls 120, solder balls 124 are mounted in recesses 144 formed in the mounting surface 103 of package substrate 104, according to an embodiment of the invention. In an embodiment, recesses 144 are formed within one or more build up layers in package substrate 104. In an embodiment, recesses 144 expose metallization to which solder balls 124 may be electrically connected, in order to perform a function critical to the operation of the package, such as transmitting input/output signals.

Figure 3A:
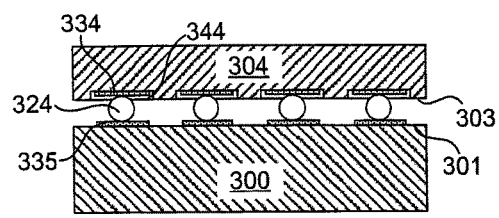
FIGS. 3A-3H illustrate cross-sectional views recess configurations according to an embodiment of the invention.

In an embodiment, each recess 144 accommodates a single solder ball 124, as illustrated in FIG. 1A. However, other configurations are possible in order to accommodate larger solder balls 124. For example, FIGS. 3A-3D illustrate recess configurations where a plurality of solder balls 324 are recessed in one of the circuit board 300 or package substrate 304. In FIG. 3A, individual recesses 344 are located in the mounting surface 303 of package substrate 304, according to an embodiment of the invention. In an embodiment, individual recesses 344 extend through one or more of the buildup layers forming package substrate 304. Solder balls 324 are mounted on the land surface 301 of circuit board 300, according to an embodiment. In an embodiment, solder balls 324 are not recessed in the land surface 301 of circuit board 300. In an embodiment, solder ball 324 is mounted to package substrate 304 via a conductive pad 334 that is formed at least partially within recess 344. In an embodiment, solder ball 324 is mounted to circuit board 300 via conductive pad 335, which is formed on the land surface 301 of circuit board 300.

Figure 3B:
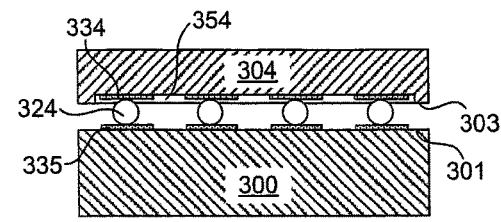

In FIG. 3B, common recess 354 in the mounting surface 303 of package substrate 304 accommodates a plurality of solder balls 324, according to an embodiment of the invention. In an embodiment, a high stress region of the package substrate 304 comprises one common recess 354, in which all of the solder balls 324 within the high stress region are mounted. In another embodiment, a high stress region comprises a plurality of common recesses 354 that each contains a plurality of solder balls 324. In another embodiment, a high stress region of a package substrate surface 303 may comprise a plurality of recesses including both common recesses 354, each containing a plurality of solder balls 324, and individual recesses 344, each containing a single solder ball 324. Common recess 354 may also comprise a plurality of conductive pads 334, which each electrically and mechanically connects a solder ball 324 to metallization within package substrate 303. Solder balls 324 are not recessed in the land surface 301 of circuit board 300, according to an embodiment. In an embodiment, solder balls 324 are mounted to the land surface 301 of circuit board 300 via conductive pads 333.

Figure 3C:
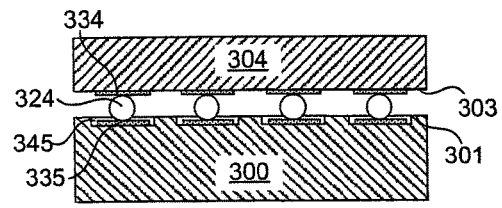

In FIG. 3C, a plurality of individual recesses 345 are formed within the land surface 301 of circuit board 300. Individual recesses 345 may extend through one or more of the buildup layers comprising circuit board 300. In an embodiment, each individual recess 345 comprises a conductive pad 343 connecting solder ball 324 to a metallization layer within circuit board 300. In an embodiment, solder balls 324 are mounted to the mounting surface 303 of package substrate 304 via conductive pads 332. That is, solder balls 324 are not recessed in the mounting surface 303 of package substrate 304 in an embodiment of the invention.

Figure 3D:
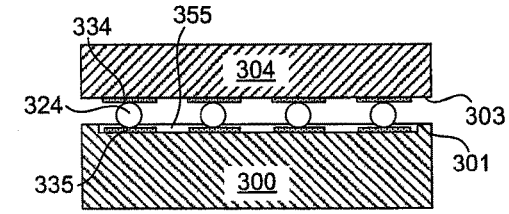

In FIG. 3D, a common recess 353 in the land surface 301 of circuit board 300 accommodates a plurality of solder balls 324. Common recess 353 may extend through one or more of the buildup layers forming circuit board 300. As with common recess 354, a high stress region may comprise one or more common recesses 353, each of which accommodate a plurality of solder balls 324. Common recess 353 may also comprise a plurality of conductive pads 333, each of which electrically and mechanically connects a solder ball 324 to metallization within circuit board 300. Solder balls 324 are not recessed in the mounting surface 303 of package substrate 304, according to an embodiment. In an embodiment, solder balls 324 are mounted to the mounting surface 303 of package substrate 304 via conductive pads 334.

Referring back to FIGS. 1A and 1D, solder balls 122 electrically and mechanically attach package 102 to circuit board 100 within peripheral high stress region 112, according to an embodiment of the invention. In an embodiment, one or more of solder balls 122 in peripheral high stress region 112 are CTF solder balls that carry input/output signal or power between circuit board 100 and package 102. In an embodiment, all of solder balls 122 are CTF. In another embodiment, some of solder balls 122 are CTF, while others are NCTF. Because at least one of the solder balls 122 in high stress region 112 is CTF, input/output signals that would otherwise have to be routed through a lower stress region 110 of the package surface (e.g. in cases where high stress regions contain only NCTF solder balls) may be routed through the high stress region 112, reducing the x-y area of the package 102 required to accommodate the minimum number of CTF solder joints.

In an embodiment, solder balls 122 have an average diameter, which is, prior to bonding and reflow, from 10 to 30% larger than the average diameter of solder balls 120 prior to bonding and reflow. In an embodiment, solder balls 122 are recessed in both the mounting surface 103 of package substrate 104 and the land surface 101 of circuit board 100 in order to accommodate the larger average diameter of solder balls 122 as compared to the average diameter of solder balls 120. In an embodiment, recesses 142 are located in the mounting surface 103 of package substrate 104. In an embodiment, recesses 143 are located in the land surface 101 of circuit board 100. In an embodiment, each recess 143 accommodates a single solder ball 122. In an embodiment, a conductive pad 132 within each recess 142 connects each CTF solder ball 122 to metallization within package substrate 104. In an embodiment, a conductive pad within each recess 143 connects each CTF solder ball 122 to metallization within circuit board 100.

Figure 3E:
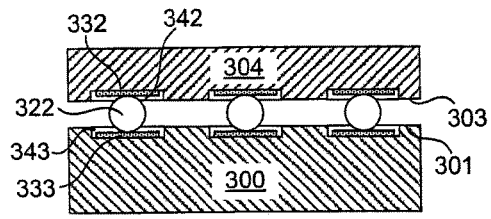

FIGS. 3E-3H illustrate recess configurations where a plurality of solder balls 324 are recessed in the surfaces of both circuit board 300 and package substrate 304, according to an embodiment of the invention. In FIG. 3E, each solder ball 322 is mounted within a pair of individual recesses formed in each of package substrate 304 and circuit board 300, according to an embodiment. Each individual recess 342 formed in the mounting surface 303 of package substrate 304 accommodates one solder ball 322, according to an embodiment. In an embodiment, a conductive pad 332 is at least partially recessed within recess 342 in order to connect each solder ball 322 to metallization (not shown) within package substrate 304. Solder balls 322 are also recessed within individual recesses 343 in the land surface 301 of circuit board 300, according to an embodiment. In an embodiment, a conductive pad 333 is at least partially recessed within individual recess 343 in order to connect each solder ball 322 to metallization (not shown) within circuit board 300.

Figure 3F:
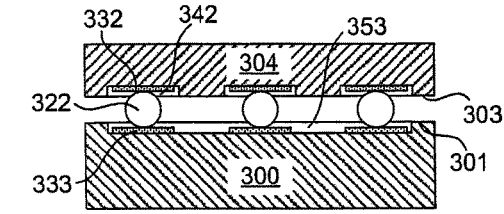

In FIG. 3F, each solder ball 322 is mounted within an individual recess 342 in the mounting surface 303 of package substrate 304, and also within a common recess 353 in land surface 301 of circuit board 300, according to an embodiment of the invention. In an embodiment, common recess 353 accommodates a plurality of solder balls 322. In an embodiment, each solder ball 322 is connected to package substrate 304 via a conductive pad 332 at least partially within an individual recess 342. In an embodiment, each solder ball 322 is connected to circuit board 300 via a conductive pad 333 at least partially within common recess 353.

Figure 3G:
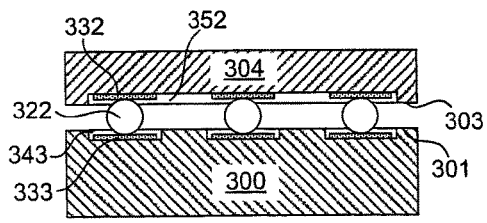

In FIG. 3G, each solder ball 322 is mounted within a common recess 352 in the mounting surface 303 of package substrate 304, and also within an individual recess 343 in land surface 301 of circuit board 300, according to an embodiment of the invention. In an embodiment, each solder ball 322 is connected to package substrate 304 via a conductive pad 332 at least partially within common recess 352. In an embodiment, each solder ball 322 is connected to circuit board 300 via a conductive pad 333 at least partially within an individual recess 343.

Figure 3H:
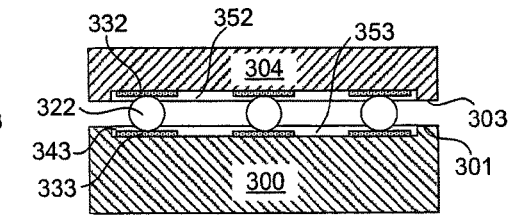

In FIG. 3H, each solder ball 322 is mounted within a pair of common recesses 352/353 in each of the package substrate 304 and circuit board 300. In an embodiment, each solder ball 322 is connected to package substrate 304 via a conductive pad 332 at least partially within common recess 352. In an embodiment, each solder ball 322 is connected to circuit board 300 via a conductive pad 333 at least partially within common recess 353.

It is to be understood that the recess configurations illustrated in FIGS. 3E-3H may be used uniformly throughout a single high stress region or in combination with other recess configurations within a single high stress region. For example, in an embodiment, a high stress region of the package substrate 304 comprises one common recess 352/353, in which all of the solder balls 322 within the high stress region are mounted. In another embodiment, a high stress region comprises a plurality of common recesses 352/353 that each contains a plurality of solder balls 322. In another embodiment, a high stress region of a package substrate surface 303 may comprise a plurality of recesses including both common recesses 352/353, each containing a plurality of solder balls 322, and individual recesses 342/343, each containing a single solder ball 322.

Referring back to FIGS. 1A-1D, it is to be understood that solder balls 122 within peripheral high stress region 112 may be accommodated by recessing the solder balls in only one surface, as shown with respect to solder balls 124. In addition, it is to be understood that solder balls 124 may be recessed in both the land surface 101 of circuit board 100 and the mounting surface 103 of package 104, as shown with respect to solder balls 122, rather than in only one of these surfaces. Similarly, solder balls having the same average diameter may have different recess configurations within different regions of the interface between the package substrate and the circuit board.

The conductive pads 132/133, and 134/135 used to connect larger solder balls 122 and 124, respectively, to package substrate 104 and circuit board 100 may be the same or a different size than conductive pads 130/131. In an embodiment, the conductive pads 132/133, and 134/135 are the same size as conductive pads 130/131, enabling more compact routing. In another embodiment, the conductive pads 132/133, and 134/135 are larger than conductive pads 130/131. Larger conductive pads may further improve the SJR of larger solder balls 122 and 124 within high stress regions.

Figure 4:
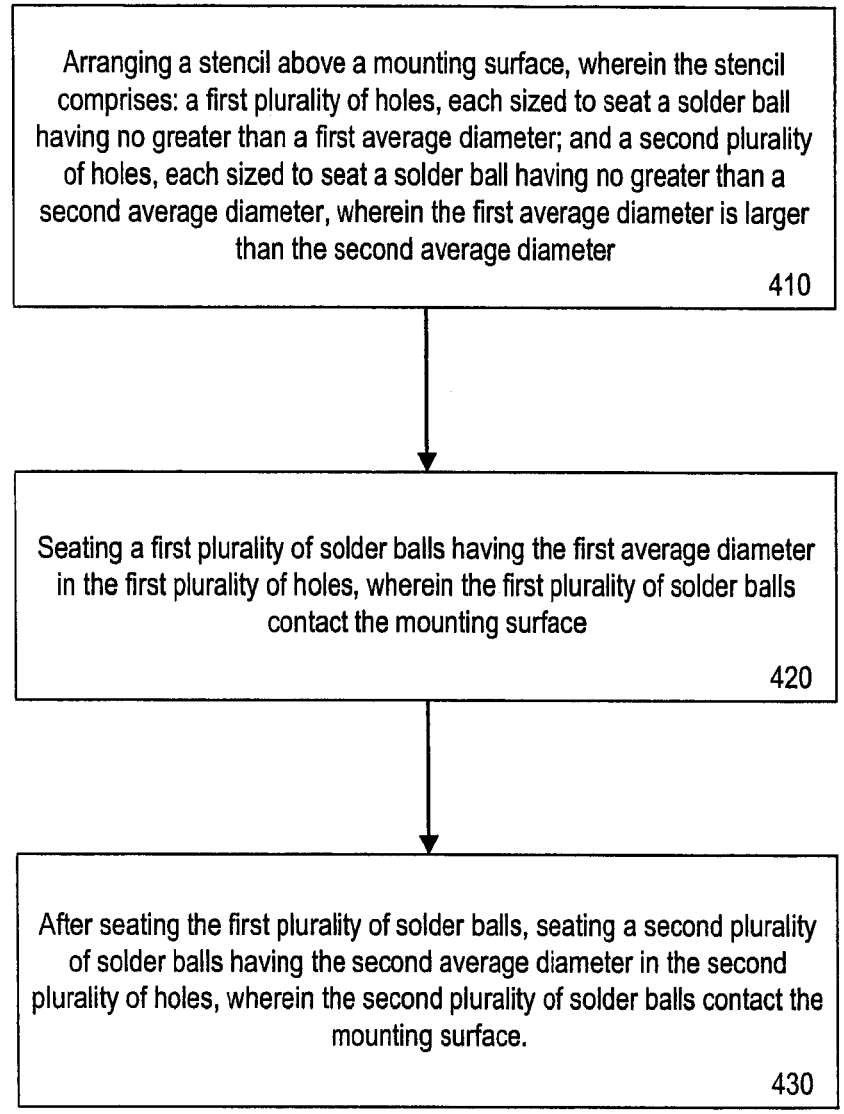
FIG. 4 illustrates a method for seating a plurality of solder balls having different average diameters, according to an embodiment of the invention.
Figure 5:
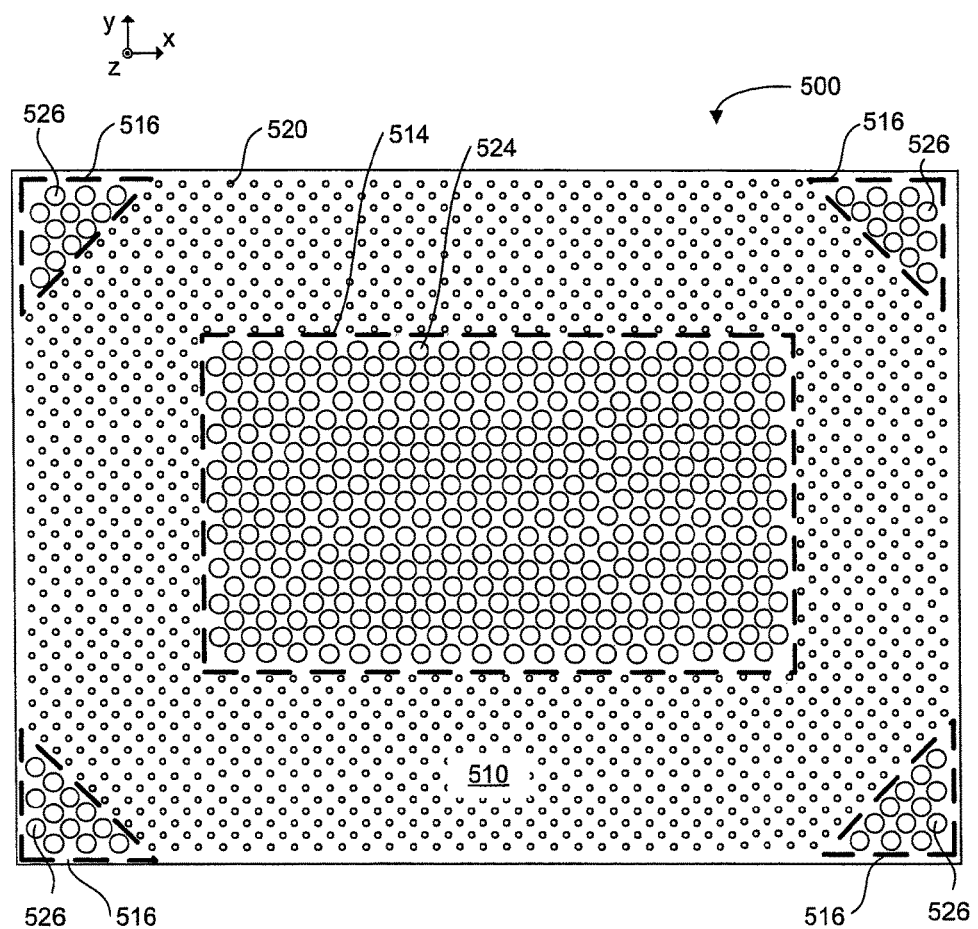
FIG. 5 illustrates a stencil opening design having plurality of hole sizes, according to an embodiment of the invention.

FIG. 4 illustrates a ball attach method for mounting a package on a circuit board using a plurality of sizes of solder balls, according to an embodiment of the invention. First, at 410, a stencil is arranged above a mounting surface, according to an embodiment. FIG. 5 illustrates an example embodiment of a stencil 500. In an embodiment, the stencil has a first plurality of holes 526/524. In an embodiment, the stencil has a second plurality of holes 520. Each of the first plurality of holes 526/524 is sized to seat a solder ball having no greater than a first average diameter, according to an embodiment. Each of the second plurality of holes 520 is sized to seat a solder ball having no greater than a second average diameter, according to an embodiment. In an embodiment, the first average diameter is larger than the second average diameter, so that the first plurality of holes 526/524 are larger than the second plurality of holes 520. It is to be understood that while holes 520/524/526 are illustrated in FIG. 5 as having a circular cross-section, holes 520/524/526 may have any cross-sectional shape that enables seating of a plurality of solder balls having the desired average diameter, for example, square, diamond, or oval shapes.

In the embodiment illustrated in FIG. 5, each of the first plurality of holes 526 is located within corner regions 516 of the stencil 500. In an embodiment, corner regions 516 of the stencil 500 correspond to corner high stress regions of a package substrate surface on which solder balls will be seated. In an embodiment, each of the first plurality of holes 524 is located within a center region 514 of the stencil 500. In an embodiment, center region 514 corresponds to the die shadow high stress region of a package substrate on which the solder balls will be seated. In an embodiment, each of the second plurality of holes 520 is located within the lower stress region 510 of a package substrate on which the solder balls will be seated.

Referring to FIG. 4, at 420 a first plurality of solder balls having the first average diameter is seated in the first plurality of holes, according to an embodiment of the invention. In an embodiment, a solder ball is seated when it comes into contact with the surface to which the solder ball will be mounted. As such, a solder ball is seated by the stencil when the solder ball fits into a hole in the stencil that aligns the solder ball in a desired position on the mounting surface, according to an embodiment. In an embodiment, the larger first plurality of solder balls do not fit within the smaller second plurality of holes 520, and therefore do not seat in positions on the mounting surface intended for the smaller second plurality of solder balls.

Next, at 430, after seating the first plurality of solder balls a second plurality of solder balls having the second average diameter are seated in the second plurality of holes, according to an embodiment of the invention. Because the larger first plurality of holes 526/524 are occupied by the first plurality of solder balls, the smaller second plurality of solder balls do not seat in positions on the package surface intended for the larger first plurality of solder balls.

It is to be understood that the method may be used to mount more than two sizes of solder balls. For example, the largest solder balls are mounted first in the largest holes, followed by the next largest solder balls in the next largest holes, and so on in order of decreasing average diameter of the solder balls. The solder balls having the smallest average diameter are mounted last. It is to be understood that this method may be applied to seating solder balls on a die surface, on a package surface, or on the surface of a PCB. In an embodiment, the mounting surface is a material formed on the surface of a package substrate, for example a conductive pad.

Figure 6:
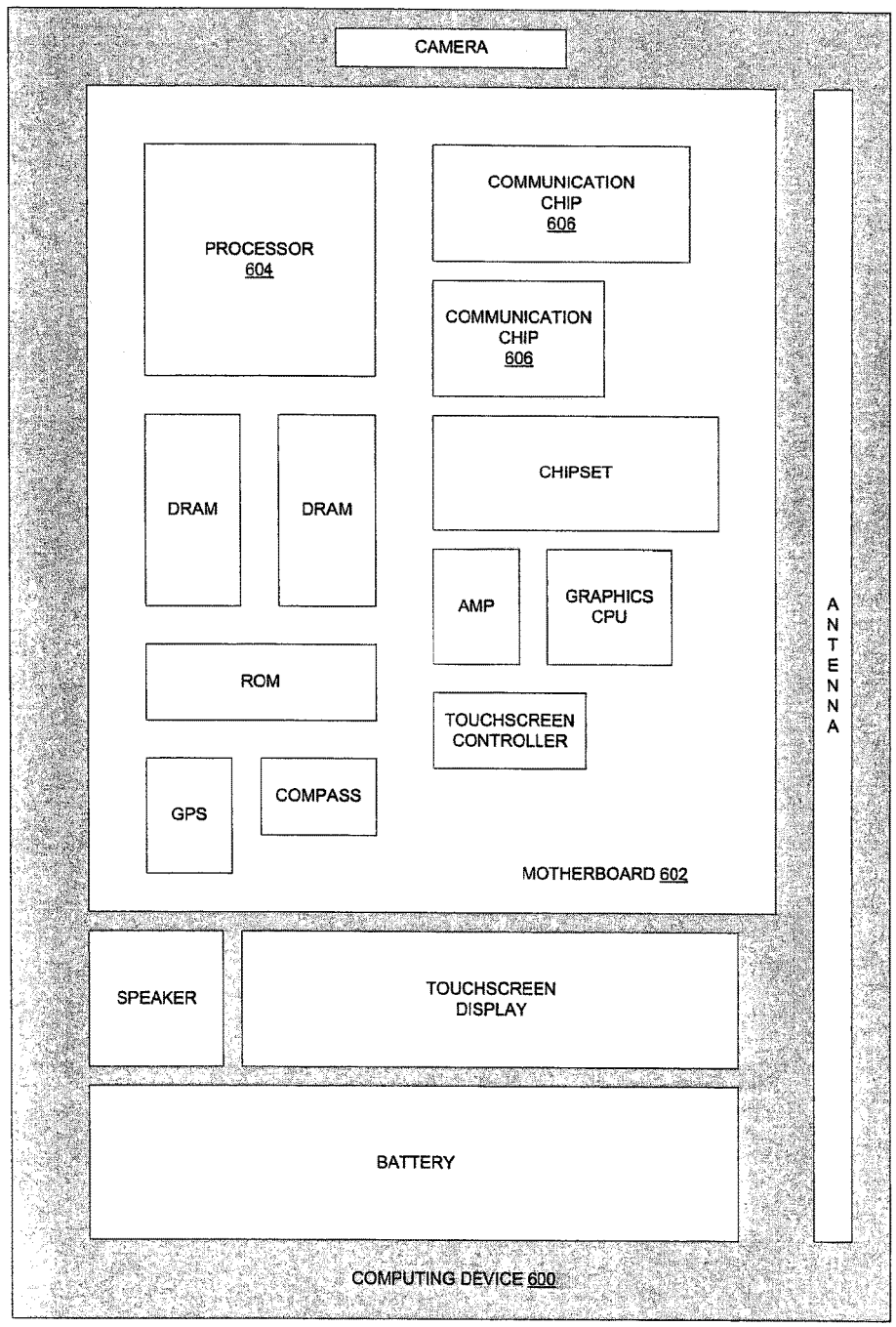
FIG. 6 illustrates a computing system implemented with a BGA structure in accordance with an example embodiment of the invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). In an embodiment, these other components are coupled to the board 602 using BGA structures having larger balls in high stress regions in accordance with embodiments of the invention.

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others. The communication chip 606 also includes an integrated circuit die packaged within the communication chip 606. In an embodiment, communication chip 606 is coupled to the board 602 using BGA structures having larger balls in high stress regions in accordance with embodiments of the invention.

The processor 604 of the computing device 600 includes an integrated circuit die packaged within the processor 604. In an embodiment, processor 604 is coupled to the board 602 using BGA structures having larger balls in high stress regions in accordance with embodiments of the invention. The term "processor" may refer to any device or portion of a device that processes electronic data from registers and/or memory to transform that electronic data into other electronic data that may be stored in registers and/or memory.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

In an embodiment, a device comprises a PCB having a land surface; a package having a mounting surface; a high stress region of the mounting surface; a first plurality of solder balls having a first average diameter electrically joining the mounting surface of the package to the land surface of the PCB within the high stress region; and a second plurality of solder balls having a second average diameter electrically joining the mounting surface of the package the land surface of the PCB outside of the high stress region, wherein the first average diameter is larger than the second average diameter. The first average diameter may be at least 10% greater than the second average diameter. At least one of the first plurality of solder balls may carry input/output signals between the PCB and the package. The mounting surface of the package may be rectangular, having four corner areas, and the high stress region may comprise the corner areas. The high stress region may comprise a periphery of the mounting surface.

In an embodiment, the package comprises a package substrate; and a die mounted on the package substrate, wherein the die has a die area, wherein the mounting surface of the package has a die shadow area aligned with the die area, and wherein the high stress region comprises the die shadow area. The die shadow area may be up to 15% larger than the die area. In an embodiment, the die is mounted on a top surface of the package substrate opposite the mounting surface. In an embodiment, the die is mounted on the mounting surface of the package. In an embodiment, the first plurality of solder balls may be mounted within one or more recesses in the mounting surface of the package. In an embodiment, the package comprises one or more buildup layers, and the one or more recesses is formed in one or more of the buildup layers. In an embodiment, the first plurality of solder balls is mounted within one or more recesses in the land surface of the PCB. In an embodiment, the package comprises one or more buildup layers, and the one or more recesses is formed in one or more of the buildup layers. In an embodiment, the first plurality of solder balls is mounted within one or more recesses in the mounting surface of the package and within one or more recesses in the land surface of the PCB. In an embodiment, the device further comprises a first plurality of contact pads coupling the respective first plurality of solder balls to each of the package and the PCB and a second plurality of contact pads coupling the respective second plurality of solder balls to each of the package and the PCB. In an embodiment, the first plurality of contact pads are at least 10% larger by area than the second plurality of contact pads. In an embodiment, the device further comprises a third plurality of solder balls electrically coupling the mounting surface of the package to the land surface of the PCB within a second high-stress region of the mounting surface, wherein a third average diameter of the third plurality of solder balls is greater than the second average diameter of the second plurality of solder balls, and wherein at least one of the third plurality of solder balls carries input/output signals between the PCB and the package.

In an embodiment, a device comprises a PCB having a land surface; a package having a mounting surface; a high stress region of the mounting surface; a first plurality of solder balls having a first average diameter electrically joining the mounting surface of the package the land surface of the PCB within the high stress region, wherein the first plurality of solder balls are each mounted within at least one recess in at least one of the land surface and the mounting surface. In an embodiment, each of the first plurality of solder balls is mounted within a recess formed in the land surface of the PCB. In an embodiment, each of the first plurality of solder balls is mounted within a recess formed in the mounting surface of the package. In an embodiment, each of the first plurality of solder balls is mounted within a pair of recesses formed in the land surface of the PCB and the mounting surface of the package. In an embodiment, the device further comprises a second plurality of solder balls having a second average diameter electrically joining the mounting surface of the package to the land surface of the PCB outside of the high stress region. In an embodiment, the first average diameter is at least 10% larger than the second average diameter. In an embodiment, the high stress region comprises corner areas of the mounting surface. In an embodiment, the high stress region comprises a periphery of the mounting surface. In an embodiment, the package further comprises a package substrate; and a die mounted on the package substrate, wherein the die has a die area, wherein the mounting surface of the package has a die shadow area aligned with the die area, and wherein the high stress region comprises the die shadow area.

In an embodiment, a method for orienting solder balls, comprises arranging a stencil above a mounting surface, wherein the stencil comprises a first plurality of holes, each sized to seat a solder ball having no greater than a first average diameter, and a second plurality of holes, each sized to seat a solder ball having no greater than a second average diameter, wherein the first average diameter is larger than the second average diameter; seating a first plurality of solder balls having the first average diameter in the first plurality of holes, wherein the first plurality of solder balls contact the mounting surface; and after seating the first plurality of solder balls, seating a second plurality of solder balls having the second average diameter in the second plurality of holes, wherein the second plurality of solder balls contact the mounting surface. The cross-sectional shape of the hole may be a circle, oval, rectangle, or diamond. The mounting surface may be a conductive pad. In an embodiment, the stencil further comprises a third plurality of holes, each sized to seat a solder ball having no greater than a third average diameter, wherein the third average diameter is smaller than the second average diameter. In an embodiment, the method further comprises, after seating the second plurality of solder balls, seating a third plurality of solder balls having a third average diameter in a third plurality of holes.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the internal spacers and the related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method for orienting solder balls, comprising:
   arranging a stencil above a mounting surface of a package substrate, the mounting surface opposite a die side surface of the package substrate, wherein the stencil comprises:
      a first plurality of holes, each sized to seat a solder ball having no greater than a first average diameter; and
      a second plurality of holes, each sized to seat a solder ball having no greater than a second average diameter, wherein the first average diameter is larger than the second average diameter;
   seating a first plurality of solder balls having the first average diameter in the first plurality of holes, wherein the first plurality of solder balls contact the mounting surface;
   after seating the first plurality of solder balls, seating a second plurality of solder balls having the second average diameter in the second plurality of holes, wherein the second plurality of solder balls contact the mounting surface; and
   mounting a die on the die side surface of the package substrate.

2. The method of claim 1, wherein in the hole cross-sectional shape is selected from the group consisting of circle, oval, rectangle, and diamond.

3. The method of claim 1, wherein the stencil further comprises:
   a third plurality of holes, each sized to seat a solder ball having no greater than a third average diameter, wherein the third average diameter is smaller than the second average diameter.

4. The method of claim 1 wherein the method further comprises:

after seating the second plurality of solder balls, seating a third plurality of solder balls having a third average diameter in a third plurality of holes.

5. The method of claim 1 wherein the first average diameter is at least 10% greater than the second average diameter.

6. The method of claim 5 wherein the mounting surface of the package substrate is rectangular having four corner areas and wherein the first plurality of solder balls are disposed in the corner areas.

7. The method of claim 5 wherein the mounting surface is rectangular having a periphery and wherein the first plurality of solder balls are disposed in the periphery of the mounting surface.

8. The method of claim 5, wherein the die has a die area, wherein the mounting surface of the package has a die shadow area aligned with the die area, and wherein the first plurality of solder balls are disposed within the die shadow area.

* * * * *